United States Patent
Nakamura et al.

(10) Patent No.: US 12,463,451 B2
(45) Date of Patent: Nov. 4, 2025

(54) UNINTERRUPTIBLE POWER SUPPLY DEVICE AND UNINTERRUPTIBLE POWER SUPPLY SYSTEM

(71) Applicant: TOSHIBA MITSUBISHI-ELECTRIC INDUSTRIAL SYSTEMS CORPORATION, Chuo-ku (JP)

(72) Inventors: Koki Nakamura, Chuo-ku (JP); Ryohei Kozu, Chuo-ku (JP)

(73) Assignee: TMEIC CORPORATION, Chuo-ku (JP)

( * ) Notice: Subject to any disclaimer, the term of this patent is extended or adjusted under 35 U.S.C. 154(b) by 0 days.

(21) Appl. No.: 18/251,747

(22) PCT Filed: Sep. 29, 2021

(86) PCT No.: PCT/JP2021/035939
§ 371 (c)(1),
(2) Date: May 4, 2023

(87) PCT Pub. No.: WO2023/053288
PCT Pub. Date: Apr. 6, 2023

(65) Prior Publication Data
US 2023/0411990 A1 Dec. 21, 2023

(51) Int. Cl.
*H02M 5/45* (2006.01)
*H02J 9/06* (2006.01)
(Continued)

(52) U.S. Cl.
CPC .............. *H02J 9/06* (2013.01); *H02M 7/797* (2013.01); *H05K 7/20172* (2013.01); *H05K 7/20909* (2013.01)

(58) Field of Classification Search
CPC ...... H02J 9/06; H02M 7/797; H05K 7/20172; H05K 7/20909
(Continued)

(56) References Cited

U.S. PATENT DOCUMENTS

2011/0076876 A1* 3/2011 Fleisig ................ H01R 25/003
439/501
2012/0242206 A1* 9/2012 Gasser ............... H05K 7/20609
312/236

(Continued)

FOREIGN PATENT DOCUMENTS

JP          11-215734 A       8/1999

OTHER PUBLICATIONS

Office Action dated Feb. 13, 2025, issued in counterpart KR Application No. 10-2023-7016403, with English Translation. (12 pages).

(Continued)

*Primary Examiner* — Rexford N Barnie
*Assistant Examiner* — Swarna N Chowdhuri
(74) *Attorney, Agent, or Firm* — Oblon, McClelland, Maier & Neustadt, L.L.P.

(57) ABSTRACT

A fan unit is disposed on an upper surface of a housing, and includes a fan, a frame member, and a support member. The frame member is disposed to surround an outer circumference of an opening provided in an upper surface of the housing. The support member supports the fan above the opening while being fixed to the frame member. A gap is provided between a lower end of a first surface of the frame member and the upper surface of the housing. A first blocking member is connected to the first surface of the frame member to be slidable in a vertical direction. In a state in which the gap is exposed, at least one second blocking member is inserted through the gap into the frame member to block the opening in the upper surface of the housing.

5 Claims, 11 Drawing Sheets

(51) Int. Cl.
    *H02M 7/797*  (2006.01)
    *H05K 7/14*   (2006.01)
    *H05K 7/20*   (2006.01)
(58) Field of Classification Search
    USPC .......................................................... 307/65
    See application file for complete search history.

(56) References Cited

U.S. PATENT DOCUMENTS

2016/0270262 A1* 9/2016 Crawford ............ H04L 41/0803
2016/0316586 A1* 10/2016 Lai ......................... H02B 1/36
2016/0338220 A1* 11/2016 Crawford ........... H05K 7/20745

OTHER PUBLICATIONS

International Search Report issued Oct. 26, 2021 in PCT/JP2021/035939 filed on Sep. 29, 2021, 2 pages.

* cited by examiner

FIG.10
(A)
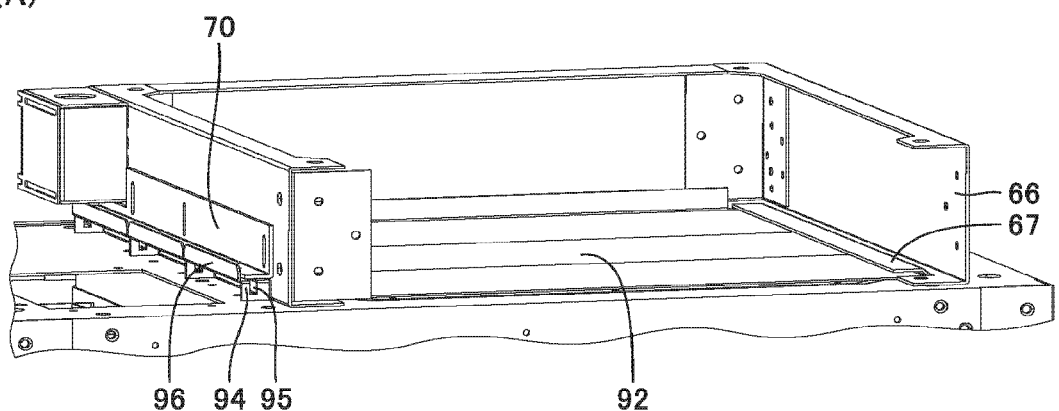
(B)
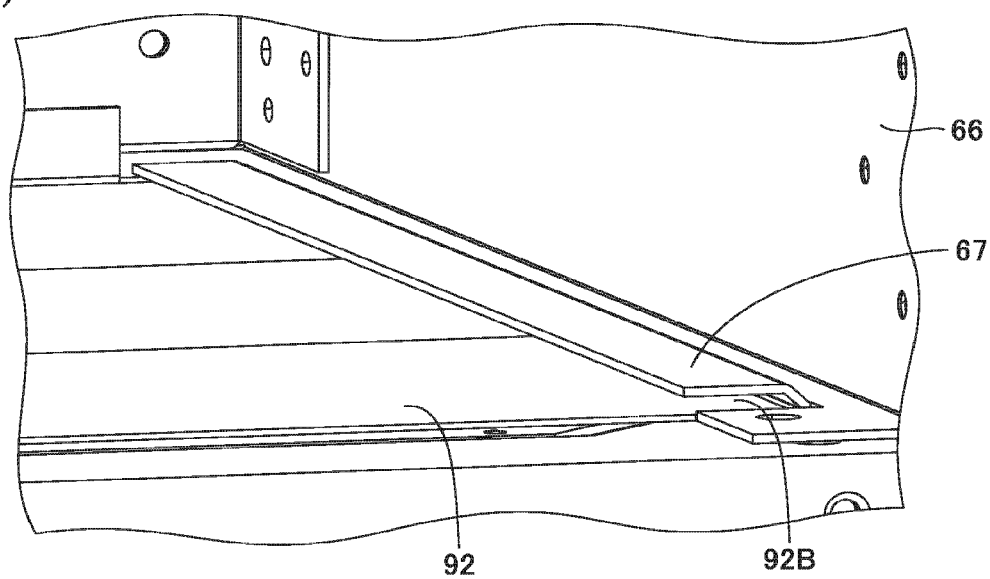

UNINTERRUPTIBLE POWER SUPPLY DEVICE AND UNINTERRUPTIBLE POWER SUPPLY SYSTEM

TECHNICAL FIELD

The present disclosure relates to an uninterruptible power supply device and an uninterruptible power supply system.

BACKGROUND ART

Japanese Patent Laying-Open No. 11-215734 (PTL 1) discloses an uninterruptible power supply device including a fan for releasing heat generated inside a housing to the outside. In PTL 1, the fan is mounted on a panel configured to be separable from the housing. The panel is fixed to the housing with screws. In the above-described configuration, for replacement of the fan, the screws are removed while the panel is supported, and thereby, the panel is detached from the housing. Then, a replacement fan is fixed to the housing with screws.

CITATION LIST

Patent Literature

PTL 1: Japanese Patent Laying-Open No. 11-215734

SUMMARY OF INVENTION

Technical Problem

In the uninterruptible power supply device disclosed in PTL 1, when the panel is detached for replacement of fan, the inside of the housing is exposed. Such a situation arises a concern that components such as screws removed from the panel may fall down into the housing. In PTL 1, the fan is replaced while the inverter is kept operated. Thus, in the state in which the panel has been detached, a voltage is already applied to a wiring member accommodated in the housing (the active state). This requires the operator to perform the operation in the vicinity of the wiring member in the active state. In such a case, the operator needs to perform the operation while paying attention so as not to contact the wiring member, with the result that the operability may decrease.

The present disclosure has been made in order to solve the above-described problems, and an object of the present disclosure is to provide an uninterruptible power supply device that makes it possible to facilitate an operation of detaching a fan from a housing while preventing a component from falling down into the housing.

Solution to Problem

According to an aspect of the present disclosure, an uninterruptible power supply device includes: a housing having a rectangular parallelepiped shape; a plurality of electric units accommodated in the housing; and a fan unit disposed on an upper surface of the housing. The upper surface of the housing is provided with an opening.

The fan unit includes a fan, a frame member, and a support member. The frame member has a rectangular outer shape and is disposed on the upper surface of the housing to surround an outer circumference of the opening. The support member supports the fan above the opening in a state in which the support member is fixed to the frame member. A gap is provided between a lower end of a first surface of the frame member and the upper surface of the housing. The uninterruptible power supply device further includes a first blocking member and at least one second blocking member. The first blocking member is connected to the first surface of the frame member to be slidable in a vertical direction. The first blocking member serves to block the gap in a state in which the first blocking member is in contact with the upper surface of the housing. In a state in which the first blocking member is slid upward and the gap is exposed, the at least one second blocking member is inserted through the gap into the frame member to block the opening.

Advantageous Effects of Invention

According to the present disclosure, an uninterruptible power supply device can be provided that makes it possible to facilitate an operation of detaching a fan from a housing while preventing a component from falling down into the housing.

BRIEF DESCRIPTION OF DRAWINGS

FIG. 10 is an external view showing an internal state of a frame member.

DESCRIPTION OF EMBODIMENTS

Figure 1:
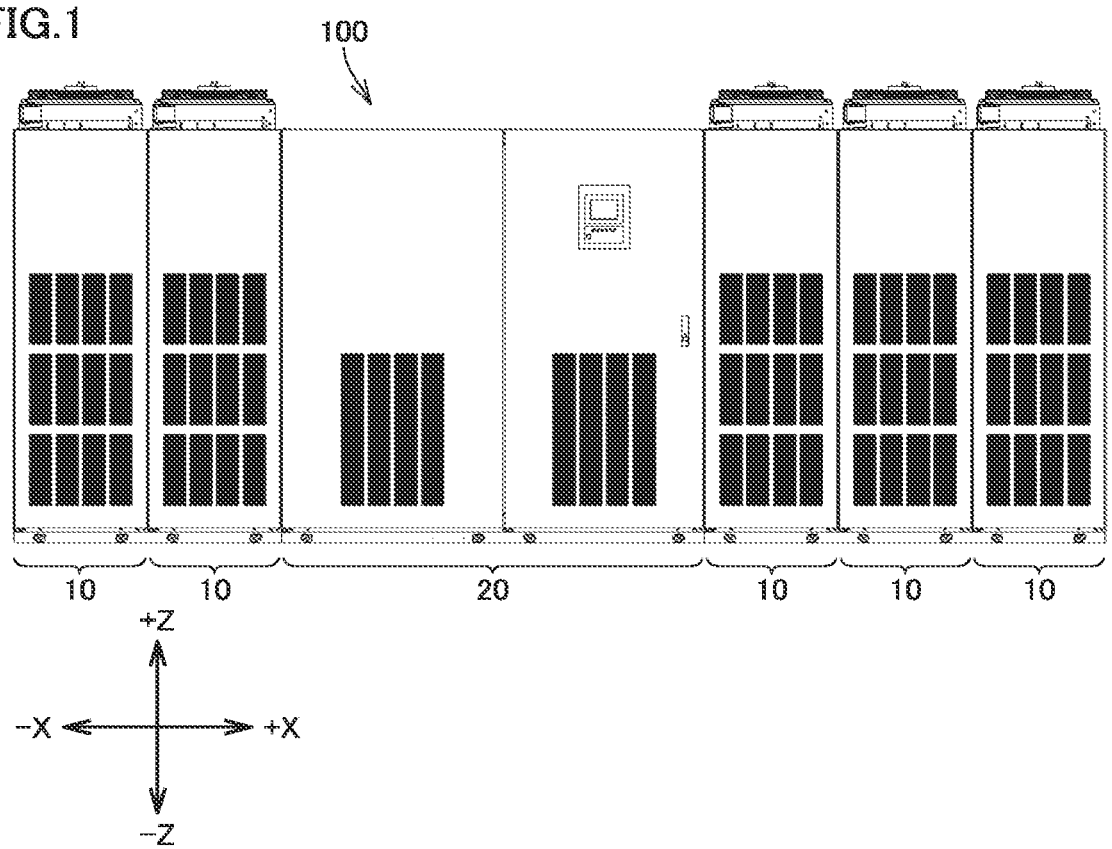
FIG. 1 is an external view showing a configuration example of an uninterruptible power supply system according to an embodiment.

In the following, embodiments of the present invention will be described in detail with reference to the accompanying drawings, in which the same or corresponding components are denoted by the same reference characters, and the description thereof will not be basically repeated.

<Configuration of Uninterruptible Power Supply System>

FIG. 1 is an external view showing a configuration example of an uninterruptible power supply system according to an embodiment.

An uninterruptible power supply system 100 is connected between an alternating-current (AC) power supply (not shown) such as a commercial power supply and a load (not shown). In the normal state (when the AC power supply normally operates), uninterruptible power supply system 100 uses the AC power supplied from the AC power supply to thereby supply electric power to the load. When a power failure occurs in the AC power supply, uninterruptible power supply system 100 uses direct-current (DC) power supplied from a power storage device (not shown) to thereby supply electric power to the load.

Uninterruptible power supply system 100 is a module-type uninterruptible power supply system and includes a plurality of UPS modules 10 and a bypass module UPS module 10 corresponds to one example of an "uninterruptible power supply device". As will be described later, uninterruptible power supply system 100 incorporates a parallel circuit of UPS modules 10 whose number corresponds to the capacity of the uninterruptible power supply system. When a number N of UPS modules 10 are required for power supply by uninterruptible power supply system 100, (N+1) UPS modules 10 are implemented to achieve redundancy, and thereby, the power supply quality can be improved.

Each of the plurality of UPS modules 10 and bypass module 20 includes a housing having a board shape (a rectangular parallelepiped shape). In the following description, it is assumed that an X-axis direction extends in the right-left direction (the horizontal direction) when the housing is viewed from the front side, a Y-axis direction extends in the anteroposterior direction, and a Z-axis direction extends in the vertical direction. Note that a +X-direction extends in the direction directed rightward in the X-axis direction while a —X-direction extends in the direction opposite to the +X-direction. Also, a +Y-direction extends in the direction directed from the front side to the rear side of uninterruptible power supply system 100 while a —Y-direction extends in the direction opposite to the +Y-direction. Further, a +Z-direction extends in the direction directed upward in the Z-axis direction while a —Z-direction extends in the direction opposite to the +Z-direction.

Figure 2:
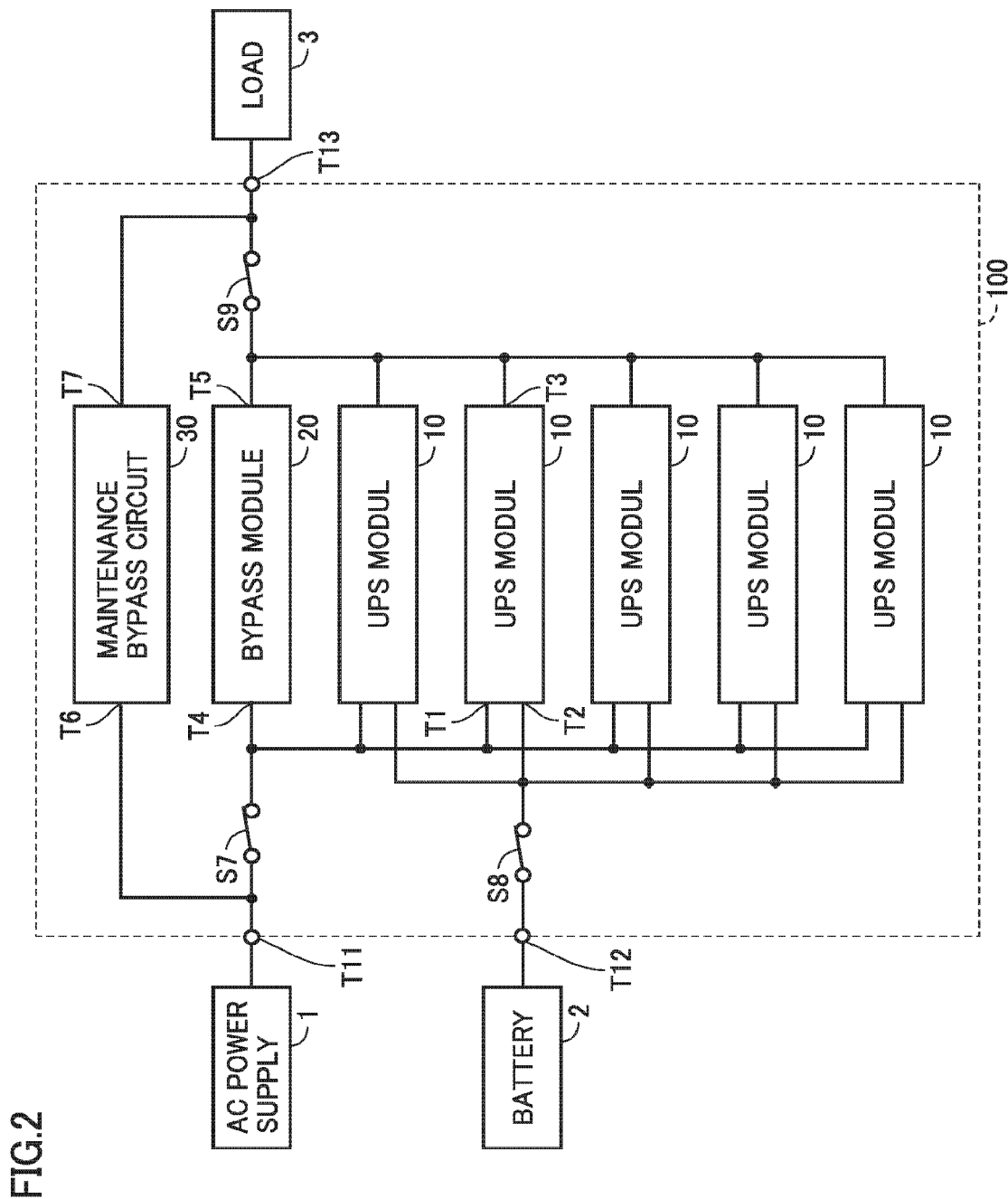
FIG. 2 is a circuit block diagram showing a configuration of the uninterruptible power supply system.

FIG. 2 is a circuit block diagram showing the configuration of uninterruptible power supply system 100.

As shown in FIG. 2, uninterruptible power supply system 100 includes an input terminal T11, a battery terminal T12, an output terminal T13, a plurality of UPS modules 10, a bypass module 20, a maintenance bypass circuit 30, and switches S7 to S9.

Input terminal T11 is connected to an AC power supply 1 and receives AC power having a commercial AC frequency. Output terminal T13 is connected to a load 3. Battery terminal T12 is connected to a battery 2. Battery 2 corresponds to one example of the power storage device. In place of battery 2, a capacitor may be connected to battery terminal T12.

Figure 3:
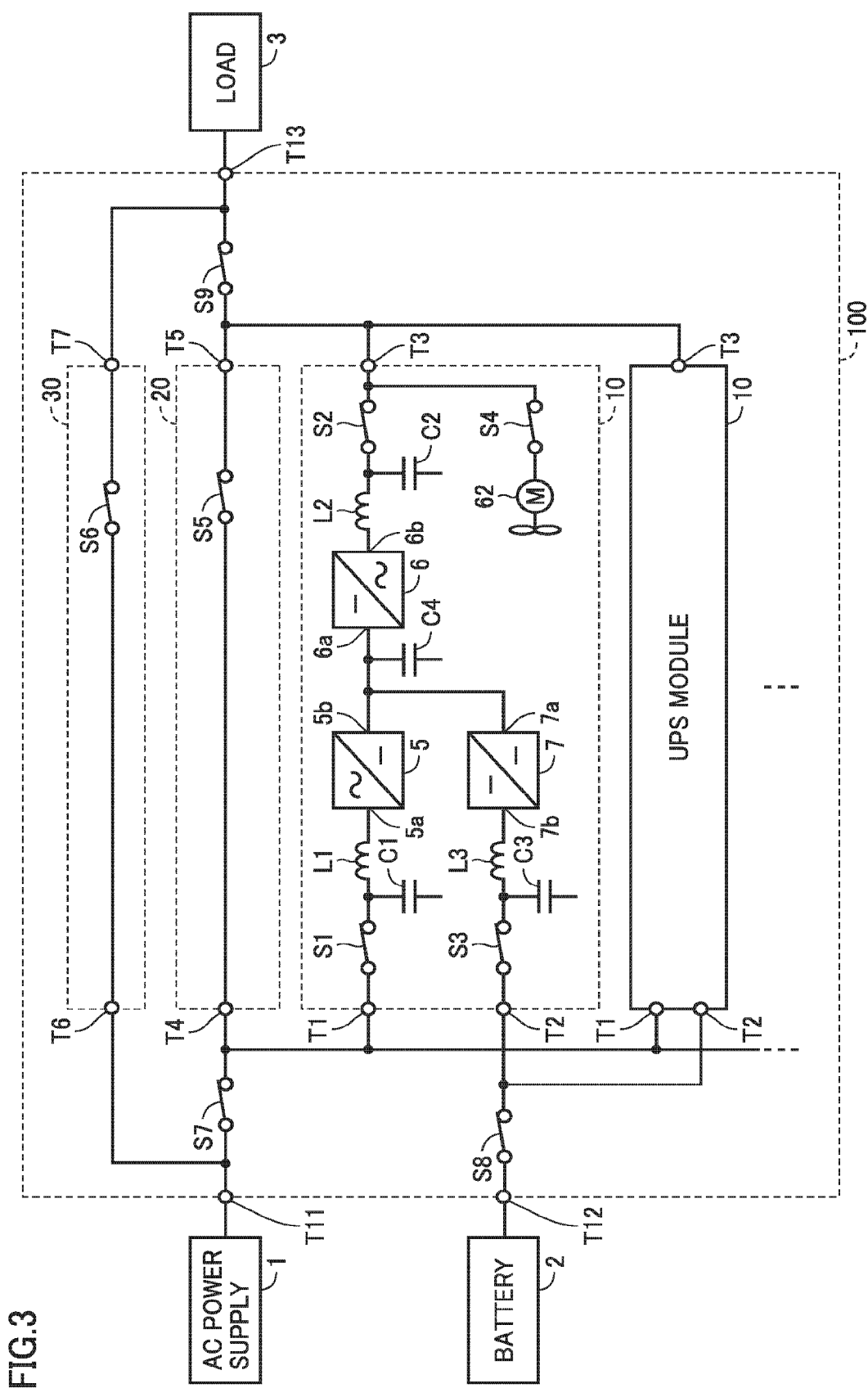
FIG. 3 is a circuit block diagram showing a configuration example of a UPS module and a bypass module.

The plurality of UPS modules 10 and bypass module 20 are connected in parallel between input terminal T11 and output terminal T13. FIG. 3 is a circuit block diagram showing a configuration example of UPS module 10 and bypass module 20.

As shown in FIG. 3, UPS module 10 includes an input terminal T1, an output terminal T3, a battery terminal T2, switches S1 to S4, capacitors C1 to C4, reactors L1 to L3, a converter 5, an inverter 6, a bidirectional chopper 7, and a fan 62.

Terminals T1, T2, and T3 are connected to terminals T11, T12, and T13, respectively. Switch S1 and reactor L1 are connected in series between input terminal T1 and an input node 5a of converter 5. Capacitor C1 is connected between a reference voltage line and a node between switch S1 and reactor L1. Switch S1 is turned on in the normal state and turned off, for example, during maintenance inspection or a failure of UPS module 10. Capacitor C1 and reactor L1 constitute an AC input filter (a low-pass filter) that allows the AC power from AC power supply 1 to flow through con-verter 5 and suppresses leakage of a signal having a carrier frequency generated in converter 5 to the AC power supply 1 side.

Converter 5 converts AC power from AC power supply 1 into DC power. Capacitor C4 is connected between an output node 5b of converter 5 and the reference voltage line, and smoothes the output voltage from converter 5. Output node 5b of converter 5, an input node 6a of inverter 6, and a first node 7a of bidirectional chopper 7 are connected to each other. Inverter 6 converts the DC power from converter 5 or bidirectional chopper 7 into AC power having a commercial frequency.

Reactor L2 and switch S2 are connected in series between an output node 6b of inverter 6 and output terminal T3. Capacitor C2 is connected between a reference voltage line and a node between reactor L2 and switch S2. Reactor L2 and capacitor C2 constitute an AC output filter (a low-pass filter) that allows the AC power from inverter 6 to flow through load 3 and suppresses leakage of a signal having a carrier frequency generated in inverter 6 to the load 3 side.

Switch S2 is turned on in an "inverter power feed mode" in which the AC power generated in inverter 6 is supplied to load 3, and turned off in a "bypass power feed mode" in which the AC power from AC power supply 1 is supplied to load 3 through bypass module 20. Further, switch S2 is turned off during maintenance inspection or a failure of UPS module 10.

Switch S3 and reactor L3 are connected in series between battery terminal T2 and a second node 7b of bidirectional chopper 7. Capacitor C3 is connected between a reference voltage line and a node between switch S3 and reactor L3. Switch S3 is turned on in the normal state and turned off, for example, during maintenance inspection of UPS module 10 or battery 2. Capacitor C3 and reactor L3 constitute a low-pass filter that allows DC power to flow therethrough and suppresses leakage of a signal having a carrier frequency generated in bidirectional chopper 7 to the battery 2 side.

Bidirectional chopper 7 supplies the DC power generated in converter 5 to battery 2 in the normal state in which AC power is supplied from AC power supply 1, and supplies the DC power from battery 2 to inverter 6 in a power failure state in which supply of the AC power from AC power supply 1 is stopped.

Switch S4 is connected between output terminal T3 and fan 62. Switch S4 is turned on in the normal state and turned off, for example, during maintenance inspection of UPS module 10.

The following simply describes the operation of UPS module 10. In the normal state in which AC power is supplied from AC power supply 1, the AC power is converted by converter 5 into DC power. The DC power is converted by inverter 6 into AC power, and then, supplied to load 3 and stored in battery 2 by bidirectional chopper 7.

When a power failure occurs and supply of the AC power from AC power supply 1 is stopped, the operation of converter 5 is stopped, and the DC power from battery 2 is supplied to inverter 6 by bidirectional chopper 7 and converted into AC power by inverter 6, and then, the converted AC power is supplied to load 3. Thus, even when a power failure occurs, the operation of load 3 can be continued during a time period in which DC power is stored in battery 2.

Bypass module 20 includes an input terminal T4, an output terminal T5, and a switch S5. Terminals T4 and T5 are connected to terminals T11 and T13, respectively. Switch S5 is connected between terminals T4 and T5. Switch S5 is turned on in a bypass power feed mode and turned off in an inverter power feed mode.

As described above, uninterruptible power supply system 100 includes the plurality of UPS modules 10 and bypass module 20 connected in parallel between AC power supply 1 and load 3. Therefore, the number of UPS modules 10 and bypass modules 20 connected in parallel can be adjusted according to the size of load 3, with the result that various loads can be readily supported.

Switch S7 is connected between input terminal T11 and input terminals T1, T4. Switch S8 is connected between battery terminal T12 and battery terminal T2. Switch S9 is connected between output terminals T3, T5 and output terminal T13. Switches S7 to S9 are turned on in the normal state and turned off, for example, during maintenance inspection of uninterruptible power supply system 100.

Maintenance bypass circuit 30 includes an input terminal T6, an output terminal T7, and a switch S6. Terminals T6 and T7 are connected to terminals T11 and T13, respectively. Switch S6 is connected between terminals T6 and T7. Switch S6 is turned off in the normal state and turned on, for example, during maintenance inspection of uninterruptible power supply system 100. Although not shown, maintenance bypass circuit 30 is mounted as a peripheral device in uninterruptible power supply system 100 shown in FIG. 1.

<Configuration of UPS Module 10>

Figure 4:
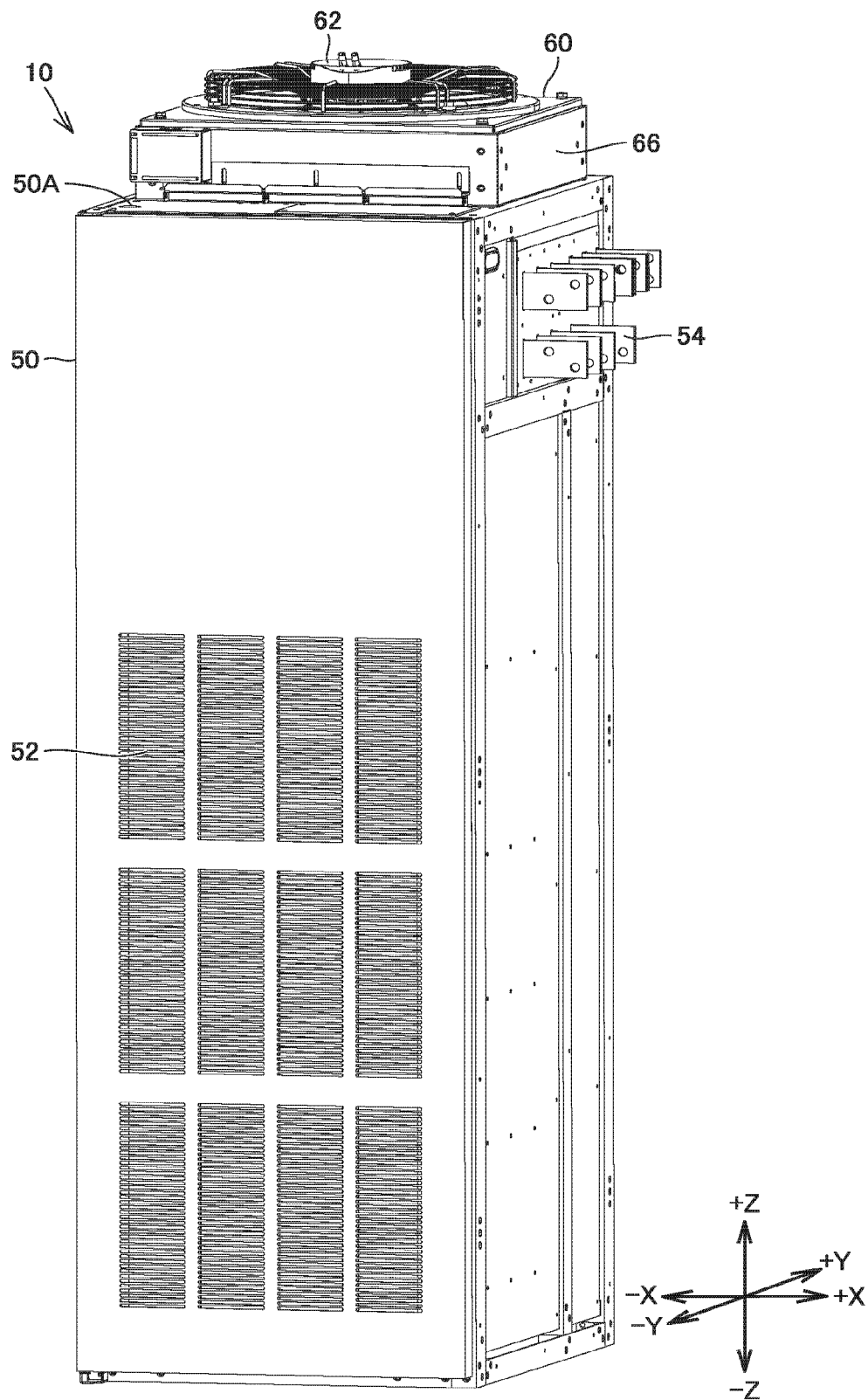
FIG. 4 is a schematic external view showing a configuration of the UPS module.

The following describes the configuration of UPS module 10 with reference to FIG. 4.

FIG. 4 is a schematic external view showing a configuration of UPS module 10.

As shown in FIG. 4, UPS module 10 includes a housing 50 having a board shape (a rectangular parallelepiped shape), a plurality of bus bars 54, and a fan unit 60. Housing 50 accommodates a plurality of electric units such as a power converter, a capacitor, a reactor, and a wiring member shown in FIG. 3, which constitute UPS module 10. Although not shown, some electric units each have a substantially rectangular parallelepiped shape and are stacked at intervals in the Z-axis direction.

The plurality of bus bars 54 correspond to respective terminals T1, T2, and T3 (FIG. 3) and are provided to extend from the side surface of housing 50 in the X-axis direction (the right-left direction) to the outside of housing 50. The plurality of bus bars 54 are electrically connected to the plurality of bus bars 54 provided in other UPS modules 10 and bypass module 20 (not shown).

Housing 50 has a front surface provided with an air vent 52 through which air outside housing 50 is introduced into housing 50. Housing 50 has an upper surface provided with an opening (not shown) through which air inside housing 50 is discharged to the outside of housing 50.

Fan unit 60 is disposed on upper surface 50A of housing 50. Fan unit 60 includes fan 62. Fan 62 is configured to introduce air inside housing 50 through an opening 55 (see FIG. 7) provided in upper surface 50A of housing 50 and discharge the introduced air to the outside of housing 50. Thereby, air is introduced into housing 50 through air vent 52 provided in the front surface of housing 50, and the introduced air flows through each electric unit to thereby promote dissipation of heat from each electric unit. The air heated after having flowed through the plurality of electric units is discharged from opening 55 (see FIG. 7) in upper surface 50A of housing 50 through fan 62 to the outside of housing 50. In the example in FIG. 4, fan unit 60 includes one fan 62, but the number of fans 62 is not limited to one.

For example, a plurality of small fans may be arranged side by side on upper surface 50A of housing 50.

<Configuration of Fan Unit 60>

In UPS module 10 described above, fan 62 is detached from housing 50 when fan 62 is inspected for maintenance or replaced with a new product. As a method of detaching a fan from a housing, for example, PTL 1 discloses that, in a configuration in which a panel having the fan fixed thereto is fixed to a housing of an uninterruptible power supply device with screws, this panel is detached from the housing by removing the screws while supporting the panel.

However, in the structure in which fan unit 60 is attached to upper surface 50A of housing 50 as shown in FIG. 4, when a fastening member 65 such as a screw used for fixing fan unit 60 to upper surface 50A is removed during detachment of fan unit 60, removed fastening member 65 may erroneously fall down into housing 50 through opening 55 (see FIG. 7) provided in upper surface 50A of housing 50.

Also, when fan unit 60 is detached, the electric units such as bus bars 54 are exposed from opening 55 in upper surface 50A of housing 50. Thus, during the operation of uninterruptible power supply system 100, the operator is required to perform the operation at the position close to the electric unit to which a voltage is applied. In such a case, the operator needs to perform the operation while paying attention so as not to contact the electric unit, with the result that the operability may decrease.

Note that conceivable countermeasures to prevent fastening member 65 from falling down into housing 50 may be a configuration in which opening 55 in upper surface 50A of housing 50 is covered with a mesh. On the one hand, covering opening 55 with a mesh may prevent fastening member 65 from falling down, but on the other hand, such a mesh may prevent ventilation to thereby decrease the cooling performance for electric units.

In this case, uninterruptible power supply system 100 is a module-type uninterruptible power supply system as described above, and therefore, some of UPS modules 10 can be disassembled and subjected to maintenance inspection or replacement during the operation of uninterruptible power supply system 100. Accordingly, it is conceivable that, also during the operation for maintenance inspection or replacement of fan unit 60, corresponding UPS module 10 is disassembled so as not to apply a voltage to the electric units.

However, bus bars 54 are electrically connected to the corresponding bus bars of other UPS modules 10 and bypass module 20 as described above. Thus, so as not to apply a voltage to bus bars 54, it is necessary to stop not only the operation of the corresponding UPS module 10 but also the operation of the entire parallel circuit of the plurality of UPS modules 10 and bypass module 20.

In this case, in the time period during which the operation of the parallel circuit of the plurality of UPS modules 10 and bypass module 20 is stopped, switches S7 and S9 are turned off and switch S6 in maintenance bypass circuit 30 is turned on, and thereby, uninterruptible power supply system 100 can continuously feed electric power to load 3 using maintenance bypass circuit 30. However, electric power from AC power supply 1 is directly supplied to load 3 via switch S6, which arises a concern that the power feeding reliability may be temporarily impaired.

In the present embodiment, a configuration of a novel fan unit 60 that can eliminate such a concern will be described. Further, a method of detaching fan 62 in fan unit 60 will also be described.

Figure 5:
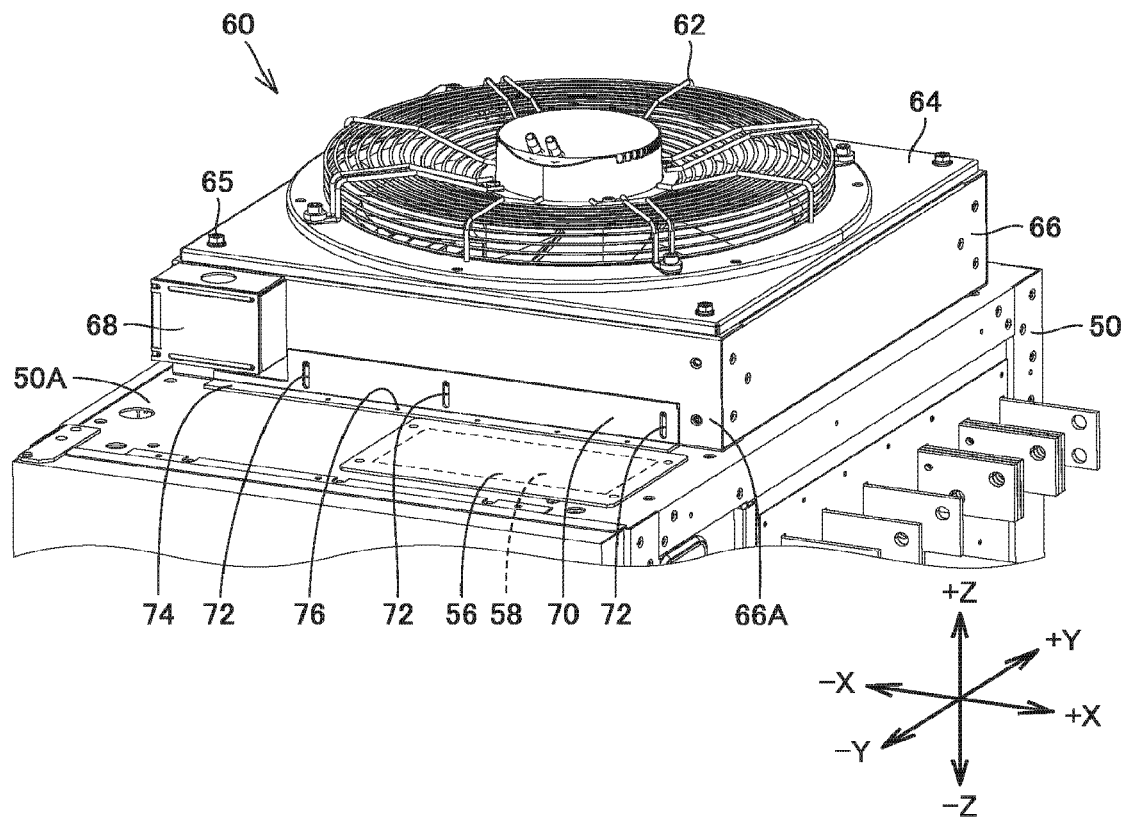
FIG. 5 is a schematic external view showing a configuration of a fan unit.

FIG. 5 is a schematic external view showing a configuration of fan unit 60. As shown in FIG. 5, fan unit 60 includes fan 62, a support member 64, a frame member 66, a terminal block box 68, and a blocking plate 70.

Support member 64 is formed in a flat plate shape having a rectangular shape in a plan view, and fan 62 is fixed to an opening provided in a central portion of support member 64.

Frame member 66 has a rectangular outer shape in a plan view and is configured to support the outer circumferential portion of support member 64. The four corners of support member 64 are fastened to frame member 66 with fastening members 65 such as screws. Support member 64 is configured to support fan 62 above opening 55 (see FIG. 7) provided in upper surface 50A of housing 50 in the state in which support member 64 is fixed to frame member 66.

Terminal block box 68 accommodates a terminal block for feeding power supply to fan 62. Terminal block box 68 is attached to a front surface 66A located on the front side of four surfaces constituting the outer shape of frame member 66. Front surface 66A corresponds to one example of the "first surface".

Frame member 66 is fixed to upper surface 50A of housing 50. Frame members 66 is disposed on upper surface 50A of housing 50 in close contact with each other so as to prevent leakage of air. However, a gap 80 (see FIG. 6) is provided between front surface 66A of frame member 66 and upper surface 50A of housing 50. Gap 80 extends in the X-axis direction.

Blocking plate 70 is configured to block gap 80 provided between front surface 66A of frame member 66 and upper surface 50A of housing 50. Blocking plate 70 corresponds to one example of the "first blocking member". Specifically, blocking plate 70 is formed of a rectangular thin plate having a long side extending in the X-axis direction. Blocking plate 70 is provided with a slit 72 extending in the Z-axis direction (the vertical direction). The number of slits 72 may be one or may be more than one.

Blocking plate 70 is fixed to front surface 66A of frame member 66 with a fastening member (not shown) such as a screw at a portion where slit 72 is located. Note that the fastening member is loosened to thereby allow blocking plate 70 to slide along slit 72 in the Z-axis direction on front surface 66A of frame member 66.

FIG. 5 shows the state in which blocking plate 70 is slid in the —Z-axis direction (the downward direction). When the lower end of blocking plate 70 comes into contact with upper surface 50A of housing 50, gap 80 is blocked by blocking plate 70. Conversely, when blocking plate 70 is slid in the +Z-axis direction (the upward direction), gap 80 is exposed (see FIG. 6). Gap 80 is normally blocked by blocking plate 70. As will be described later, when fan 62 is detached, blocking plate 70 is slid in the +Z-axis direction to thereby expose gap 80.

Blocking plate 70 has a fillet portion 74 protruding in the direction perpendicular to front surface 66A of frame member 66 (in the —Y-axis direction). The end portion of blocking plate 70 in the —Z-axis direction is bent at a right angle with respect to front surface 66A, so that fillet portion 74 is formed. Fillet portion 74 is a flat plate extending in the X-axis direction (the right-left direction). Fillet portion 74 is provided with a plurality of through holes 76 spaced apart from each other in the X-axis direction. Each through hole 76 penetrates through the flat plate in its thickness direction. Although not shown, a guide screw is inserted through each of the plurality of through holes 76.

Upper surface 50A of housing 50 is provided with an introduction port 58 through which a wiring member (not shown) is introduced into housing 50. The wiring member is connected to a terminal accommodated in housing 50. Introduction port 58 is covered with a lid portion 56. The wiring member is introduced into housing 50 through a through hole provided in lid portion 56. In order to suppress intrusion of dust into housing 50, the through hole is blocked by a resin or the like in the state in which the wiring member passes through the through hole. In the example in FIG. 5, introduction port 58 is disposed forward of fan unit 60 on upper surface 50A of housing 50.

<Method of Detaching Fan 62>

Then, a method of detaching fan 62 in fan unit 60 shown in FIG. 5 will be described. The operator can detach fan 62 from frame member 66 by sequentially performing the processes shown in FIGS. 6, 7, 9, and 11. Before detaching fan 62, the operation of corresponding UPS module 10 is stopped and switches S1 to S3 in this corresponding UPS module 10 are turned off, and thereby, this corresponding UPS module 10 is disassembled from uninterruptible power supply system 100.

Figure 6:
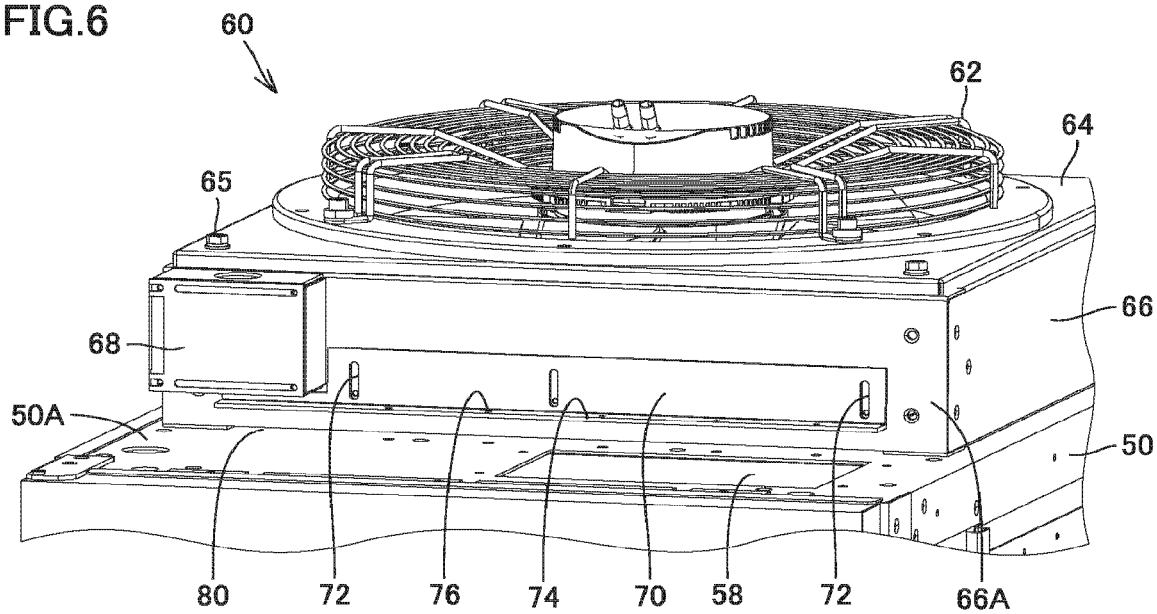
FIG. 6 is a diagram for illustrating a method of detaching a fan.

Referring to FIG. 6, a fastening member (such as a screw) inserted through slit 72 is first loosened. Blocking plate 70 is fixed to front surface 66A of frame member 66 by the fastening member. By loosening the fastening member, blocking plate 70 is unfixed from frame member 66. In this state, blocking plate 70 is slid in the +Z-axis direction (the upward direction) along slit 72. Thereby, gap 80 between front surface 66A of frame member 66 and upper surface 50A of housing 50 is exposed.

Figure 7:
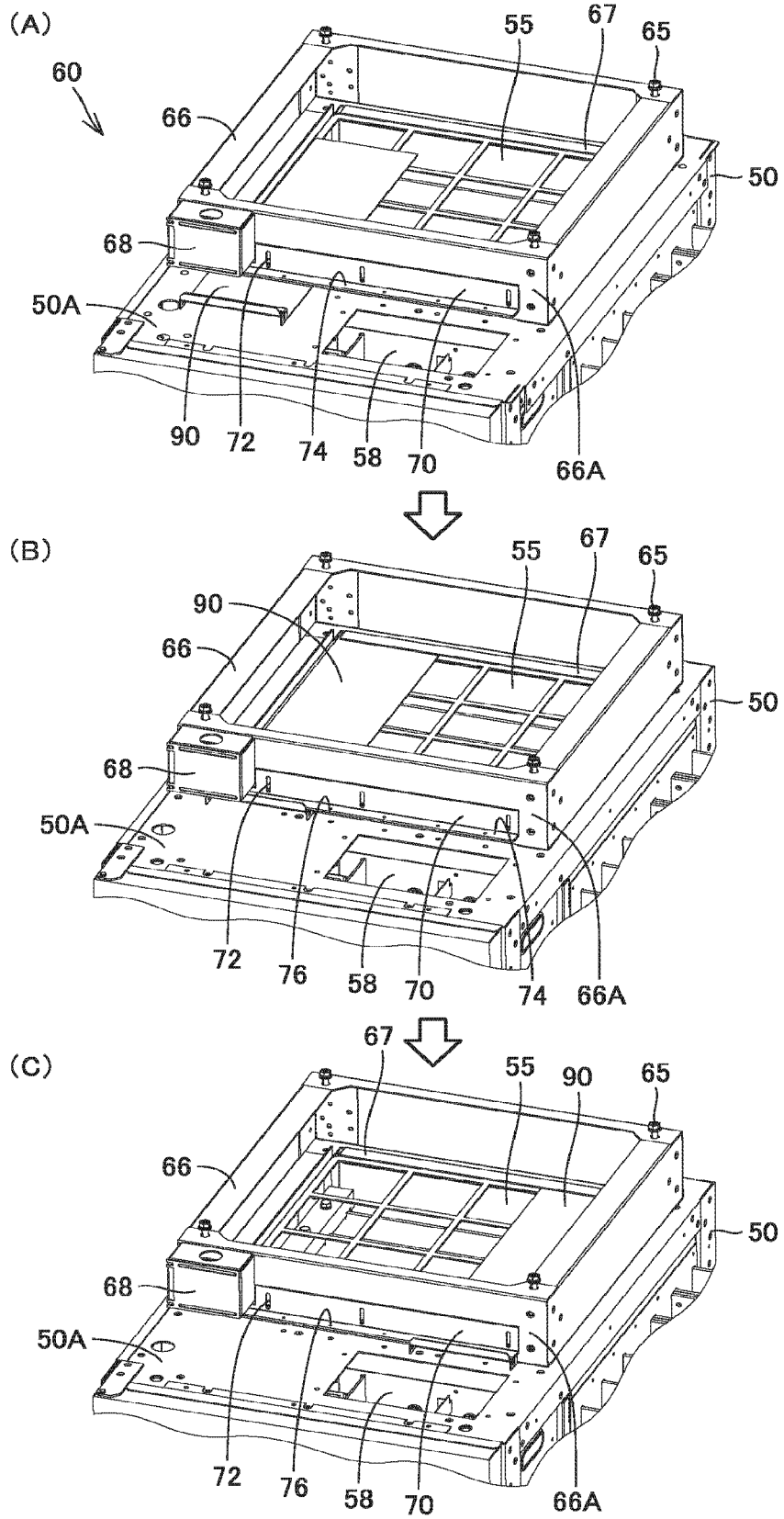
FIG. 7 is a diagram for illustrating the method of detaching a fan.

Then, as shown in FIG. 7, blocking plate 90 is inserted into frame member 66 through exposed gap 80. FIGS. 7(A) to 7(C) each show the procedure by which one blocking plate 90 is inserted into frame member 66.

Figure 9:
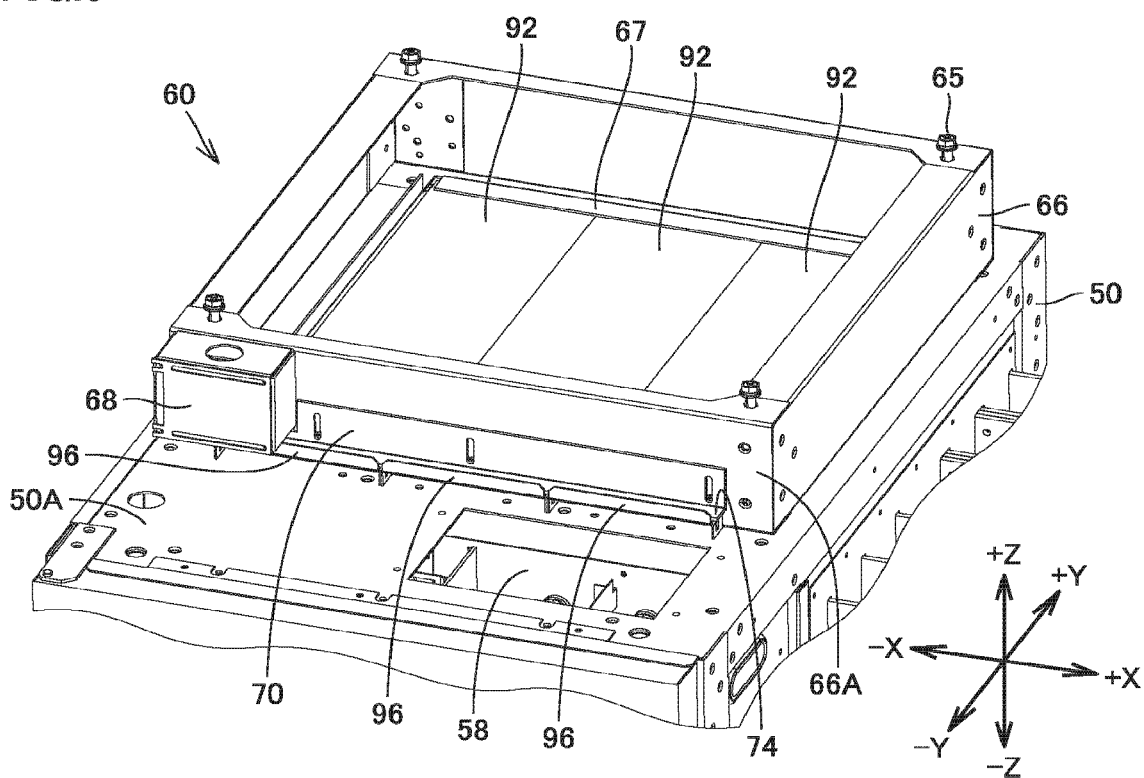
FIG. 9 is a diagram for illustrating the method of detaching a fan.
Figure 11:
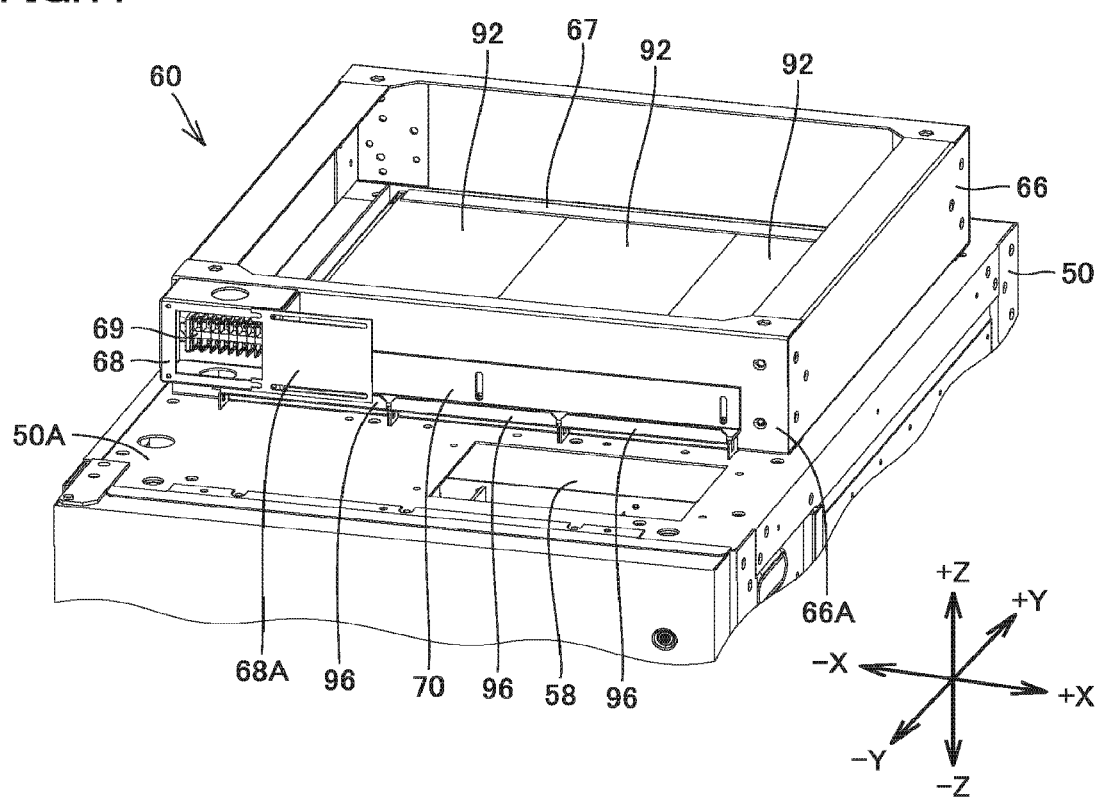
FIG. 11 is a diagram for illustrating the method of detaching a fan.

In fact, blocking plate 90 is inserted in the state in which fan 62 is fixed to frame member 66, but fan 62 is not shown in FIGS. 7, 9 and 11 for convenience of description. Further, each figure shows introduction port 58 but fails to show the wiring member and lid portion 56.

Figure 8:
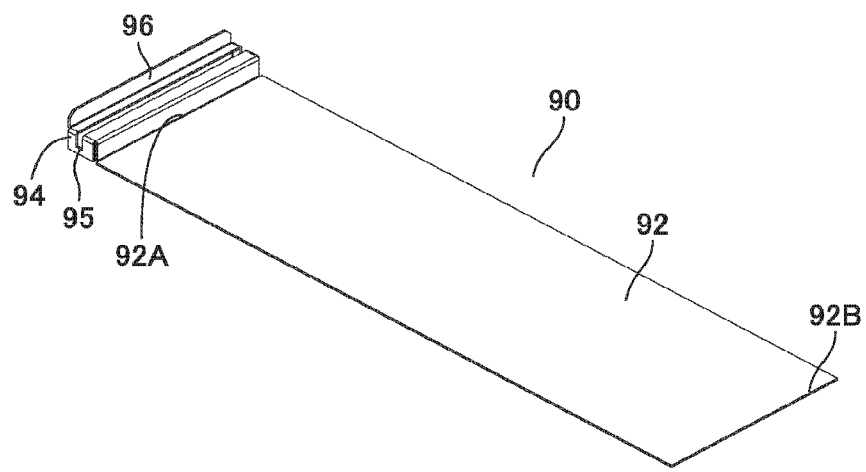
FIG. 8 is an external view showing a configuration example of a blocking plate.

Blocking plate 90 serves as a member for blocking opening 55 provided in upper surface 50A of housing 50. Blocking plate 90 corresponds to one example of the "second blocking member". FIG. 8 is an external view showing a configuration example of blocking plate 90. As shown in FIG. 8, blocking plate 90 includes a blocking portion 92, a guide portion 94, and a handle portion 96.

Blocking portion 92 is formed of a thin plate having a rectangular shape. The thickness of blocking portion 92 is shorter than the width of gap 80 in the Z-axis direction (the vertical direction).

Guide portion 94 is provided along a first end portion 92A of blocking portion 92 in the longitudinal direction. Guide portion 94 is provided with a guide groove 95. Guide groove 95 has a function of guiding a guide screw inserted through fillet portion 74 of blocking plate 70, as will be described later. Guide groove 95 is formed to extend in the direction perpendicular to the extending direction of blocking portion 92. Handle portion 96 to be held by the operator is connected to guide portion 94.

Referring back to FIG. 7(A), blocking portion 92 of blocking plate 90 is inserted into gap 80 while handle portion 96 is held. Blocking portion 92 moves in the +Y-axis direction (the direction toward the rear surface). As shown in FIG. 7(B), the movement of blocking portion 92 in the +Y-axis direction is restricted by a locking member 67 provided on the inner circumferential surface of frame member 66. Thereby, blocking portion 92 blocks a portion of opening 55 in upper surface 50A of housing 50.

At this time, guide portion 94 of blocking plate 90 is sandwiched and held in the Z-axis direction (the vertical direction) by fillet portion 74 of blocking plate 70 and upper surface 50A of housing 50. A shaft portion of a guide screw inserted through the through hole 76 of fillet portion 74 is inserted into guide groove 95 provided in guide portion 94.

Then, as shown in FIG. 7(C), in the state in which handle portion 96 is held, blocking plate 90 is moved in the +X-axis direction such that blocking portion 92 comes into contact with the end portion of gap 80 in the +X-axis direction (the rightward direction). In this case, the direction in which blocking plate 90 moves is regulated in the X-axis direction by the guide screw inserted into guide groove 95 of guide portion 94.

Specifically, when blocking plate 90 is moved in the +X-axis direction, shaft portions of a plurality of guide screws arranged at intervals in the X-axis direction are sequentially inserted into guide groove 95 of guide portion 94. Each guide screw moves in the —X-axis direction (the leftward direction) through guide groove 95. Thus, the direction in which blocking plate 90 moves is regulated in the X-axis direction. This makes it possible to suppress movement of blocking plate 90 in the Y-axis direction (the anteroposterior direction).

In FIG. 7(C), when the first blocking plate 90 comes into contact with the end portion of gap 80 in the +X-axis direction, the second blocking plate 90 is then inserted into gap 80. In the state in which handle portion 96 is held, the second blocking plate is moved in the +X-axis direction (the rightward direction) such that blocking portion 92 of the second blocking plate 90 comes into contact with blocking portion 92 of the first blocking plate 90. At this time, similarly to the first blocking plate 90, the direction in which the second blocking plate 90 moves is regulated in the X-axis direction.

In this way, the plurality of blocking plates 90 are sequentially inserted and brought into contact with blocking plate 90 adjacent thereto in the X-axis direction, and thereby, opening 55 in upper surface 50A of housing 50 is entirely blocked. FIG. 9 shows the state in which opening 55 in upper surface 50A of housing 50 is entirely blocked. In the example in FIG. 9, opening 55 is blocked by arranging three blocking plates 90 side by side in the X-axis direction. Note that the number of blocking plates is not limited. In other words, the number of blocking plates 90 may be one or may be more than one.

In the configuration in which introduction port 58 is disposed in front of gap 80 as in the present embodiment, a wiring member exists in front of gap 80, which makes it difficult to entirely block opening 55 at once by inserting a single blocking plate into gap 80. Thus, a single blocking plate is divided substantially into a plurality of blocking plates 90, which are then sequentially inserted into gap 80 and moved in the +X-axis direction, and thereby, opening 55 is entirely blocked by the plurality of blocking plates 90. Note that the number of blocking plates 90 and the direction in which each blocking plate 90 is moved are not limited to the configuration shown in FIG. 7, and may be changeable as appropriate, for example, according to the position where introduction port 58 is disposed.

In the configuration as described above, however, when blocking plate 90 is moved in the X-axis direction (the right-left direction), blocking plate 90 may move also in the Y-axis direction (the anteroposterior direction). As a result, a part of opening 55 may not be blocked by blocking plate 90 and may be exposed. The guide screw inserted into guide groove 95 of guide portion 94 and fillet portion 74 serves to suppress such a movement of blocking plate 90 in the Y-axis direction. Thereby, opening 55 can be completely blocked.

FIG. 10 is an external view showing an internal state of frame member 66. As shown in FIG. 10(A), locking member 67 is provided on the inner circumferential surface of frame member 66 so as to face gap 80. Locking member 67 extends in the X-axis direction (the right-left direction). As described above, locking member 67 serves to restrict the movement of blocking portion 92 in the +Y-axis direction.

FIG. 10(B) shows an area including locking member 67 in an enlarged manner. As shown in FIG. 10(B), locking member 67 is configured to cover a second end portion 92B of blocking portion 92 in the longitudinal direction. In the state in which second end portion 92B of blocking portion 92 is locked to locking member 67, second end portion 92B is held in the Z-axis direction (the vertical direction) by locking member 67. Thereby, rising of second end portion 92B of blocking portion 92 can be suppressed.

When opening 55 in upper surface 50A of housing 50 is entirely blocked by the plurality of blocking plates 90 according to the above-described procedure, the operation of detaching fan 62 from frame member 66 is then performed. In this operation, as shown in FIG. 11, a lid portion 68A of terminal block box 68 is first opened, and then, fan 62 is electrically disconnected from a terminal block 69.

Then, fastening members 65 disposed at four corners of support member 64 that supports fan 62 are removed from support member 64. Thereby, support member 64 is unfixed from frame member 66, so that support member 64 can be separable from frame member 66. Thus, fan 62 can be detached from fan unit 60 for performing maintenance inspection or replacement.

After maintenance inspection or replacement of fan 62 is performed, support member 64 is again fixed to frame member 66 according to the procedure in order reverse from that of the above-described procedure, and thereby, UPS module 10 is returned to the original state shown in FIG. 5. Specifically, first, support member 64 is fixed to frame member 66 by fastening member 65, and fan 62 is connected to terminal block 69. Then, the plurality of blocking plates 90 are pulled out one by one from gap according to the procedure in order reverse from that of the procedure shown in FIG. 7. Thereby, opening 55 in upper surface 50A of housing 50 is opened again. Finally, blocking plate 70 is slid in the —Z-axis direction (the downward direction) along front surface 66A of frame member 66, to thereby block gap 80.

<Functions and Effects>

The following describes the functions and effects of uninterruptible power supply system 100 according to the present embodiment.

According to uninterruptible power supply system 100 of the present embodiment, the operation of detaching fan 62 from fan unit 60 (see FIG. 11) is performed in the state in which opening 55 in upper surface 50A of housing 50 is blocked by the plurality of blocking plates 90. This makes it possible to avoid that components such as fastening member 65 removed from support member 64 erroneously fall down into housing 50.

Further, the electric units including bus bar 54 accommodated in housing 50 are not exposed from opening 55 in upper surface 50A of housing 50. Thus, the operation of detaching and attaching fan 62 can be performed while being completely separated from the electric units. Accordingly, the operator does not need to pay attention so as not to contact the electric units, which makes it possible to facilitate the operation of maintenance inspection and replacement for fan 62.

Further, even in the state in which a voltage is applied to bus bar 54 (in the active state), the operation of detaching and attaching fan 62 can be performed. Accordingly, during the operation, only corresponding UPS module 10 can be disassembled while power feeding by other UPS modules 10 can be continued. Thus, the power feeding reliability can be improved as compared with the configuration in which electric power is supplied to load 3 by using maintenance bypass circuit 30 while the operations of the plurality of UPS modules 10 and bypass module 20 are stopped.

<Other Configuration Examples>

(1) The above-described embodiments have been described regarding a configuration of fan unit 60, in which gap 80 is provided between front surface 66A of frame member 66 and upper surface 50A of housing 50, and blocking plate 90 is inserted into gap 80 from the front surface side of housing 50, but the position where gap is provided is not limited thereto. For example, gap 80 may be provided between the rear surface of frame member 66 and upper surface 50A of housing 50. In this case, blocking plate 70 is provided on the rear surface of frame member 66 and configured to be slidable in the Z-axis direction (the vertical direction) so as to block gap 80. Blocking plate 90 is inserted through gap 80 into frame member 66 from the rear surface side of housing 50.

(2) The above-described embodiments have been described regarding a configuration in which the plurality of blocking plates 90 are used to block opening 55 in upper surface 50A of housing 50. However, in the configuration in which no wiring member or the like exists around gap 80, openings 55 can be configured to be collectively blocked by one blocking plate 90. In such a configuration, blocking plate does not need to be moved in the X-axis direction (the right-left direction), which makes it possible to eliminate the need to provide guide groove 95 in blocking plate 90 as well as fillet portion 74 and guide screws in blocking plate 70.

(3) The above-described embodiments have been described regarding a configuration in which the uninterruptible power supply device according to the present disclosure is applied to each of the plurality of UPS modules 10 connected in parallel in module-type uninterruptible power supply system 100, but application of the present disclosure is not limited to a module-type uninterruptible power supply system. Thus, the uninterruptible power supply device according to the present disclosure can also be applicable, for example, to an uninterruptible power supply device formed of a single housing.

It should be understood that the embodiments disclosed herein are illustrative and non-restrictive in every respect. The technical scope of the present disclosure is defined by the terms of the claims, rather than the description above, and is intended to include any modifications within the meaning and scope equivalent to the terms of the claims.

REFERENCE SIGNS LIST

1 AC power supply, 2 battery, 3 load, 5 converter, 6 inverter, 7 bidirectional chopper, 10 UPS module, 20 bypass module, 30 maintenance bypass circuit, 50 housing, 50A upper surface, 52 air vent, 54 bus bar, 55 opening, 56, 68A lid portion, 58 introduction port, 60 fan unit, 62 fan, 64 support member, 65 fastening member, 66 frame member, 66A front surface, 67 locking member, 68 terminal block box, 69 terminal block, 70, 90 blocking plate, 72 slit, 74 fillet portion, 76 through hole, 80 gap, 92 block portion, 94 guide portion, 95 guide groove, 96 handle portion, 100 uninterruptible power supply system, C1 to C4 capacitor, L1 to L3 reactor, S1 to S9 switch, T1, T4, T6, T11 input terminal, T2, T12 battery terminal, T3, T5, T7, T13 output terminal.

The invention claimed is:

1. An uninterruptible power supply device comprising:
a housing having a rectangular parallelepiped shape;
a plurality of electric units accommodated in the housing; and
a fan unit disposed on an upper surface of the housing, wherein
the upper surface of the housing is provided with an opening from which at least one of the plurality of electric units is exposed,
the fan unit includes:
  a fan,
  a frame member having a rectangular outer shape and disposed on the upper surface of the housing to surround an outer circumference of the opening, and
  a support member that supports the fan above the opening in a state in which the support member is fixed to the frame member,
wherein a gap is provided between a lower end of a first surface of the frame member and the upper surface of the housing,
wherein the uninterruptible power supply device further comprises:
a first blocking member connected to the first surface of the frame member to be slidable in a vertical direction, the first blocking member serving to block the gap in a state in which the first blocking member is in contact with the upper surface of the housing, and
at least one second blocking member inserted through the gap into the frame member to block the opening in a state in which the first blocking member is slid upward and the gap is exposed, and
wherein the at least one second blocking member includes a plurality of second blocking members,
the second blocking members are arranged side by side in an extending direction of the gap,
each of the second blocking members includes:
  a blocking portion having a flat plate shape and serving to block a part of the opening,
  a guide portion provided at a first end portion of the blocking portion in an extending direction of the blocking portion, and
  a handle portion connected to the guide portion,
the first blocking member includes:
  a fillet portion having a flat plate shape and protruding in a direction perpendicular to the first surface of the frame member, the fillet portion being provided with a plurality of through holes penetrating through the fillet portion in a thickness direction of the fillet portion, and
  a plurality of guide screws inserted through respective ones of the through holes, and
the guide portion is provided with a guide groove for guiding the guide screws in an extending direction of the gap.

2. The uninterruptible power supply device according to claim 1, wherein the support member is fixed to the frame member by a fastening member.

3. The uninterruptible power supply device according to claim 1, wherein
   the at least one second blocking member includes:
      a blocking portion having a flat plate shape and serving to block at least a part of the opening, and
      a handle portion provided at a first end portion of the blocking portion in an extending direction of the blocking portion, and
   the uninterruptible power supply device further comprises a locking member provided in an inner circumference of the frame member to hold a second end portion of the blocking portion in the extending direction.

4. The uninterruptible power supply device according to claim 1, wherein
   the first blocking member is provided with a slit extending in the vertical direction, and
   the first blocking member is fixed to the first surface of the frame member by a fastening member inserted through the slit.

5. An uninterruptible power supply system comprising:
   an input terminal to which AC power is supplied from an AC power supply;
   an output terminal from which AC power is output to a load; and
   a plurality of uninterruptible power supply modules connected in parallel between the input terminal and the output terminal, wherein
   each of the uninterruptible power supply modules includes the uninterruptible power supply device according to claim 1.

* * * * *